United States Patent
Hsieh et al.

(10) Patent No.: US 11,256,180 B2
(45) Date of Patent: Feb. 22, 2022

(54) PROCESSING APPARATUS AND METHOD THEREOF

(71) Applicant: TAIWAN SEMICONDUCTOR MANUFACTURING CO., LTD., Hsinchu (TW)

(72) Inventors: Fu-Chun Hsieh, Hsinchu (TW); Pei-Yi Su, Taichung (TW); Chih-Che Lin, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/398,019

(22) Filed: Apr. 29, 2019

(65) Prior Publication Data
US 2020/0341390 A1    Oct. 29, 2020

(51) Int. Cl.
*G03F 7/20* (2006.01)
*G03F 7/16* (2006.01)
*G03F 7/32* (2006.01)
*G03F 7/11* (2006.01)
*G03F 7/038* (2006.01)
(Continued)

(52) U.S. Cl.
CPC .......... *G03F 7/70925* (2013.01); *G03F 7/038* (2013.01); *G03F 7/039* (2013.01); *G03F 7/0382* (2013.01); *G03F 7/0392* (2013.01); *G03F 7/11* (2013.01); *G03F 7/162* (2013.01); *G03F 7/168* (2013.01); *G03F 7/2002* (2013.01); *G03F 7/2004* (2013.01); *G03F 7/3021* (2013.01); *G03F 7/322* (2013.01)

(58) Field of Classification Search
CPC .... G03F 7/70925; G03F 7/038; G03F 7/0382; G03F 7/039; G03F 7/0392; G03F 7/11; G03F 7/162; G03F 7/168; G03F 7/2002; G03F 7/2004; G03F 7/3021; G03F 7/322; H01L 21/67051; H01L 21/67028; H01L 21/02057; H01L 21/02041; H01L 21/02068; H01L 21/67207
See application file for complete search history.

(56) References Cited

U.S. PATENT DOCUMENTS 6,059,891 A * 5/2000 Kubota ............ H01L 21/67046
                                                    134/18
6,228,561 B1 * 5/2001 Hasebe .................... G03F 7/162
                                                    430/311
(Continued)

FOREIGN PATENT DOCUMENTS

JP            11040642 A *    2/1999

*Primary Examiner* — Peter B Kim
(74) *Attorney, Agent, or Firm* — Maschoff Brennan

(57) ABSTRACT

A method includes transferring a wafer into a first processing chamber by using a robot arm mechanism, and applying a photoresist on the wafer in a first processing chamber. The wafer is transferred from the first processing chamber into a second processing chamber by using the robot arm mechanism, and the photoresist is exposed to a pattern of light in the second processing chamber. The method includes transferring the wafer from the second processing chamber into a third processing chamber by using the robot arm mechanism, and developing the exposed wafer in the third processing chamber. The method includes cleaning the robot arm mechanism in a dummy chamber.

20 Claims, 9 Drawing Sheets

(51) Int. Cl.
    *G03F 7/039*     (2006.01)
    *G03F 7/30*     (2006.01)

(56) References Cited

U.S. PATENT DOCUMENTS

| | | | | |
|---|---|---|---|---|
| 2003/0145791 | A1* | 8/2003 | Shinya | H01L 21/67017 |
| | | | | 118/724 |
| 2006/0177586 | A1* | 8/2006 | Ishida | H01L 21/67745 |
| | | | | 427/299 |
| 2006/0219258 | A1* | 10/2006 | Gast | H01L 21/02063 |
| | | | | 134/2 |
| 2007/0233313 | A1* | 10/2007 | Ikari | H01L 21/67028 |
| | | | | 700/213 |
| 2009/0194237 | A1* | 8/2009 | Nozawa | H01L 21/67748 |
| | | | | 156/345.41 |
| 2009/0202951 | A1* | 8/2009 | Yamamoto | B05D 5/06 |
| | | | | 430/322 |
| 2011/0200949 | A1* | 8/2011 | Nakamura | G03F 7/0035 |
| | | | | 430/325 |
| 2012/0034369 | A1* | 2/2012 | Ito | C23C 16/52 |
| | | | | 427/8 |
| 2012/0325269 | A1* | 12/2012 | Rebstock | H01L 21/67028 |
| | | | | 134/18 |
| 2013/0020284 | A1* | 1/2013 | Osada | H01L 21/67028 |
| | | | | 216/57 |
| 2013/0112224 | A1* | 5/2013 | Nakaharada | H01L 22/20 |
| | | | | 134/18 |
| 2013/0330928 | A1* | 12/2013 | Ishikawa | H01L 21/0274 |
| | | | | 438/694 |
| 2016/0118275 | A1* | 4/2016 | Inoue | H01L 21/67051 |
| | | | | 134/56 R |

* cited by examiner

PROCESSING APPARATUS AND METHOD THEREOF

BACKGROUND

Manufacturing of an integrated circuit (IC) has been driven by increasing the density of the IC formed in a semiconductor device. This is typically accomplished by implementing more aggressive design rules to allow a larger density of the IC device to be formed. Nonetheless, the increased density of IC devices, such as transistors, has also increased the complexity of processing semiconductor devices with decreased feature sizes. IC devices are formed by complex fabrication processes such as lithography. During lithography a semiconductor workpiece is subjected to different processing steps.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
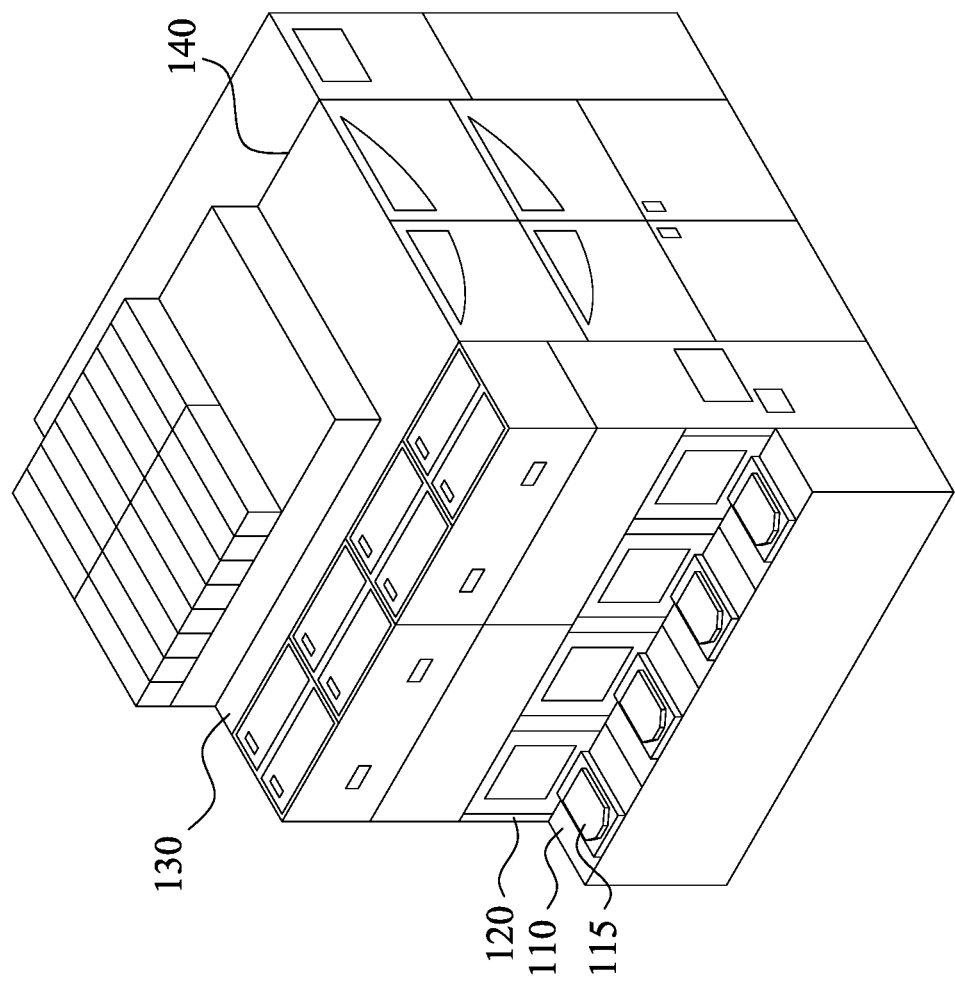
FIG. 1A is a perspective view of a processing apparatus in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
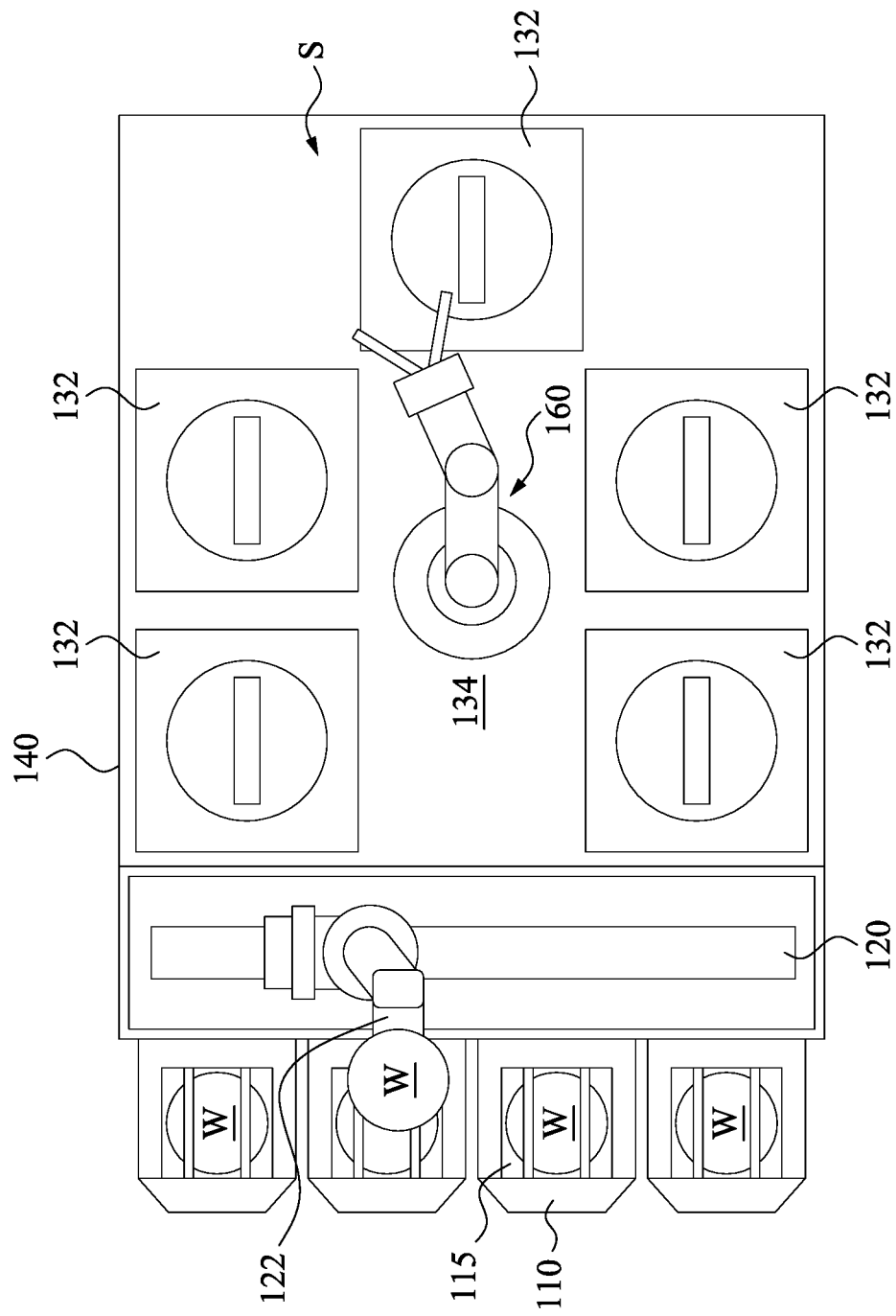
FIG. 1B is a plan view of the processing apparatus shown in FIG. 1A.

FIG. 1A is a perspective view of a processing apparatus in accordance with some embodiments of the present disclosure. FIG. 1B is a plan view of the processing apparatus shown in FIG. 1A. As shown in FIG. 1A and FIG. 1B, the processing apparatus 100, which may be referred to a photolithography tool as well, includes one or more load ports 110, a transfer module 120, a processing rack 130 and an enclosure 140. The one or more load ports 110 can be configured to accept one or more cassettes 115 that may contain one or more wafers W, which are to be processed in the processing apparatus. In some embodiments, each of the load ports 110 includes a front opening unified pod (FOUP) stage to accept the cassette 115.

The transfer module 120 is assigned with a plurality of transfer destinations to transfer the wafers W between the load ports 110 and the processing rack 130. In some embodiments, the transfer module 120 may be a robot assembly having a range of motion sufficient to transfer the wafer W from the load ports 110 to the processing rack 130. For example, the transfer module 120 may include a front end robot 122 that is adapted to access the processing rack 130 and the load ports 110. Therefore, the front end robot 122 is capable of transferring the wafer W between the cassettes 115 placed on the load ports 110 and the processing rack 130. In some embodiments, the transfer module 120 may further include a shuttle robot (not shown) that is adapted to transfer the wafer W between the chambers 132 retained in the processing rack 130. In some other embodiments, the transferring the wafer W can be achieved by the front end robot 122 as well, and in such cases, the shuttle robot may be omitted.

In some embodiments, the transfer module 120 and the processing rack 130 are enclosed by the enclosure 140. In other words, the enclosure 140 has an interior space S, and the transfer module 120 and the processing rack 130 are located within the interior space S of the enclosure 140. The load ports 110 are present between the interior space S and an exterior external to the enclosure 140. In other words, the interior space S and the exterior external to the enclosure 140 can be spatially isolated by the load port 110 when a door (not shown) of the load port 110 is closed. By using such a configuration, transportation of the wafer W between the chambers 132 of the processing rack 130 can be confined in the interior space S of the enclosure 140, and contamination to the wafer W during the transportation can be reduced because the transportation can be confined in the interior space S of the enclosure 140.

The processing rack 130 includes multiple chambers 132. Within the processing rack 130, wafers W are generally prepared and processed through the deposition and treatment of multiple layers of conductive and semiconductive materials. Such chambers 132 process semiconductor wafers W through a series of sequential steps to create integrated circuits. The chambers 132, including process chambers and preparatory chambers can be arranged in the processing rack 130. In some embodiments, a central portion 134 of processing rack 130 is surrounded by chambers 132. A robot arm mechanism 160 is implemented the enclosure 140 and is disposed within the central portion 134 of the processing rack 130. The robot arm mechanism 160 includes a plurality of robot arms 162 associated with processing chambers 132, respectively.

Figure 2:
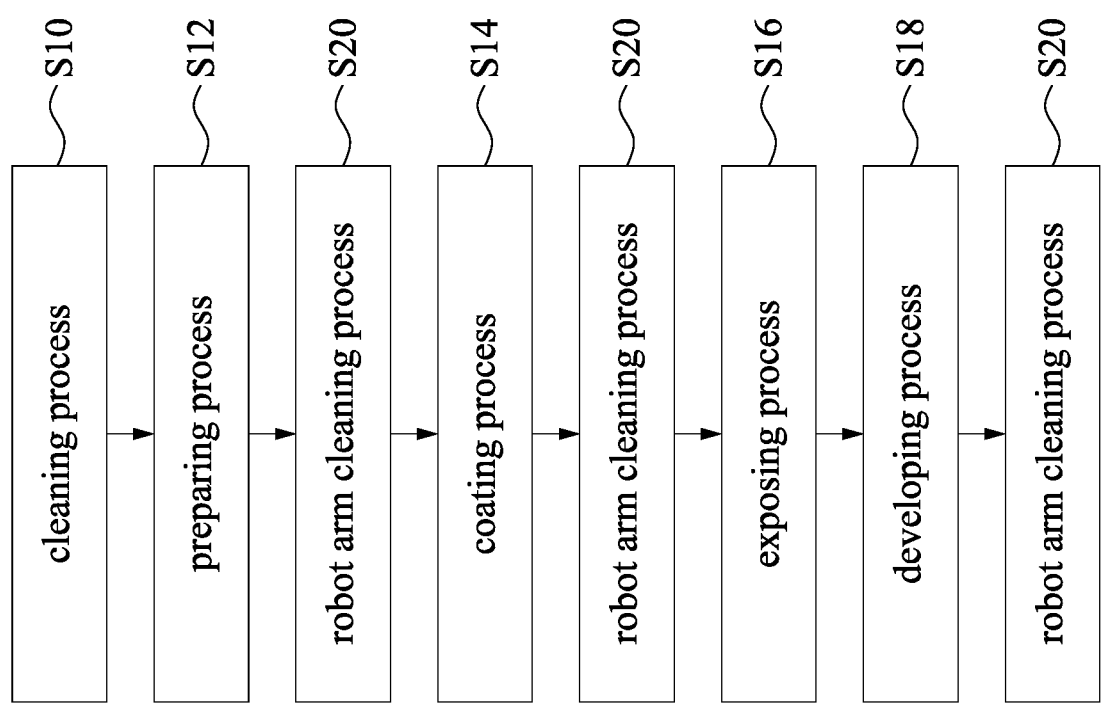
FIG. 2 is a flowchart of operations performed on a wafer in the processing apparatus in accordance with some embodiments of the present disclosure.

Operations performed on a wafer in the processing apparatus will be described in greater detail with additional reference to FIG. 2. FIG. 2 is a flowchart of operations performed on a wafer in the processing apparatus in accordance with some embodiments of the present disclosure. As previously described, the number of the process chambers of the processing apparatus is plural, and hence, various processes are performed on the wafer. In some embodiments, a combination of the various processes is a photolithography method and the various processes at least include a coating process, an exposing process, and a developing process. Furthermore, in various embodiments, the various processes further include a pre-treatment process before the coating process. In such embodiments in which the various processes further include the pre-treatment process before the coating process, the pre-treatment process includes a cleaning process and a preparing process. The cleaning process, the preparing process, the coating process, the exposing process, and the developing process are shown as operations S10-S50 in FIG. 2.

In the operation S10, a cleaning process is performed with the wafer in a cleaning chamber, in which a wet chemical treatment is used to remove organic or inorganic contaminants present on the wafer surface. For example, an RCA clean procedure based on solutions containing hydrogen peroxide is used, in which the RCA clean procedure is a set of wafer cleaning steps performed before high-temperature processing steps. In such embodiments where a wet chemical treatment is used, other solutions made with trichloroethylene, acetone or methanol are used to perform cleaning.

In the operation S12, a preparing process is performed with the wafer in a preparing chamber, in which the wafer is initially heated to a temperature sufficient to remove moisture that is present on the wafer surface. In some embodiments, a liquid or gaseous adhesion promoter is applied to promote adhesion of a photoresist to the wafer, such as Bis(trimethylsilyl)amine (also known as hexamethyldisilazane, or HMDS). The surface layer of silicon dioxide on the wafer reacts with HMDS to form tri-methylated silicon-dioxide, which is a water repellent layer. This water repellent layer prevents the aqueous developer from penetrating between the photoresist and the wafer surface, thus preventing so-called lifting of small photoresist structures in the (developing) pattern. In various embodiments, in order to ensure the development of the pattern, the wafer with the adhesion promoter is placed over a hot plate and is heated for drying.

In the operation S14, a coating process is performed with the wafer in a spin coating chamber, in which the coating process includes forming a photoresist on the wafer in accordance with some embodiments. In some embodiments, the operation of forming the photoresist on the wafer further includes applying the photoresist on the wafer. In such embodiments including applying the photoresist on the wafer, the wafer is covered with the photoresist by a spin coating process. Thus, a viscous liquid solution of the photoresist is dispensed onto the wafer, and the wafer is spun rapidly to produce a uniformly thick layer. The spin coating process results in a uniform thin layer thereon. This uniformity is explained by detailed fluid-mechanical modeling, which shows that the photoresist moves much faster at the top of the layer than at the bottom, where viscous forces bind the photoresist to the wafer surface. Explained in a different way, the top layer of the photoresist is quickly ejected from the wafer edge while the bottom layer creeps slowly and radially along the wafer. In addition, a final thickness of the photoresist is also determined by the evaporation of liquid solvents from the photoresist. In various embodiments, the photoresist-coated wafer is then pre-baked to remove excess photoresist solvent on a hotplate.

In the operation S16, an exposing process is performed with the wafer in an exposing chamber, in which the exposing process includes exposing the photoresist to a pattern of light in accordance with some embodiments. In such embodiments involving exposing the photoresist to a pattern of light, the photoresist is exposed to a pattern of intense light after prebaking. The exposure to light causes a chemical change that allows some of the photoresist to be removed by a solution, which is referred to as a developer. With such operations, a positive photoresist becomes soluble in the developer when exposed. On the other hand, a negative photoresist with unexposed regions is soluble in the developer. In some embodiments, a post-exposure bake is performed before developing to reduce standing wave phenomena caused by the destructive and constructive interference patterns of the incident light. In some embodiments, in deep ultraviolet lithography, chemically amplified resist chemistry is used.

In the operation S18, a developing process is performed with the wafer in a developing chamber, in which the developing process includes developing the exposed photoresist. In such embodiments involving developing the exposed photoresist, the develop agent is delivered on a spinner, much like a photoresist. In various embodiments, the developer includes sodium hydroxide, and metal-ion-free developers such as tetramethylammonium hydroxide are used. Furthermore, in some embodiments, a post-bake process is used after the developing process, in which the post-bake process is used to harden the final resist pattern of the photoresist. In the post-bake process, the resin polymer in the photoresist is processed to cross-link under a high temperature. The temperature at which flow begins is related to the glass transition temperature and is a measure of the thermal stability of the photoresist. In addition to cross-linking, the post-bake process removes residual solvent, water, and gasses, and improves adhesion of the photoresist to the wafer.

As discussed above, various chemicals such as the adhesion promotor, the photoresist, the develop agent, or the like, have been applied on the surface of the wafer. However, some of the chemicals may drip and adhere at the sidewall and the back surface of the wafer, and the chemicals may adhere on the robot arm when the wafer is transferred by the robot arm.

Figure 3:
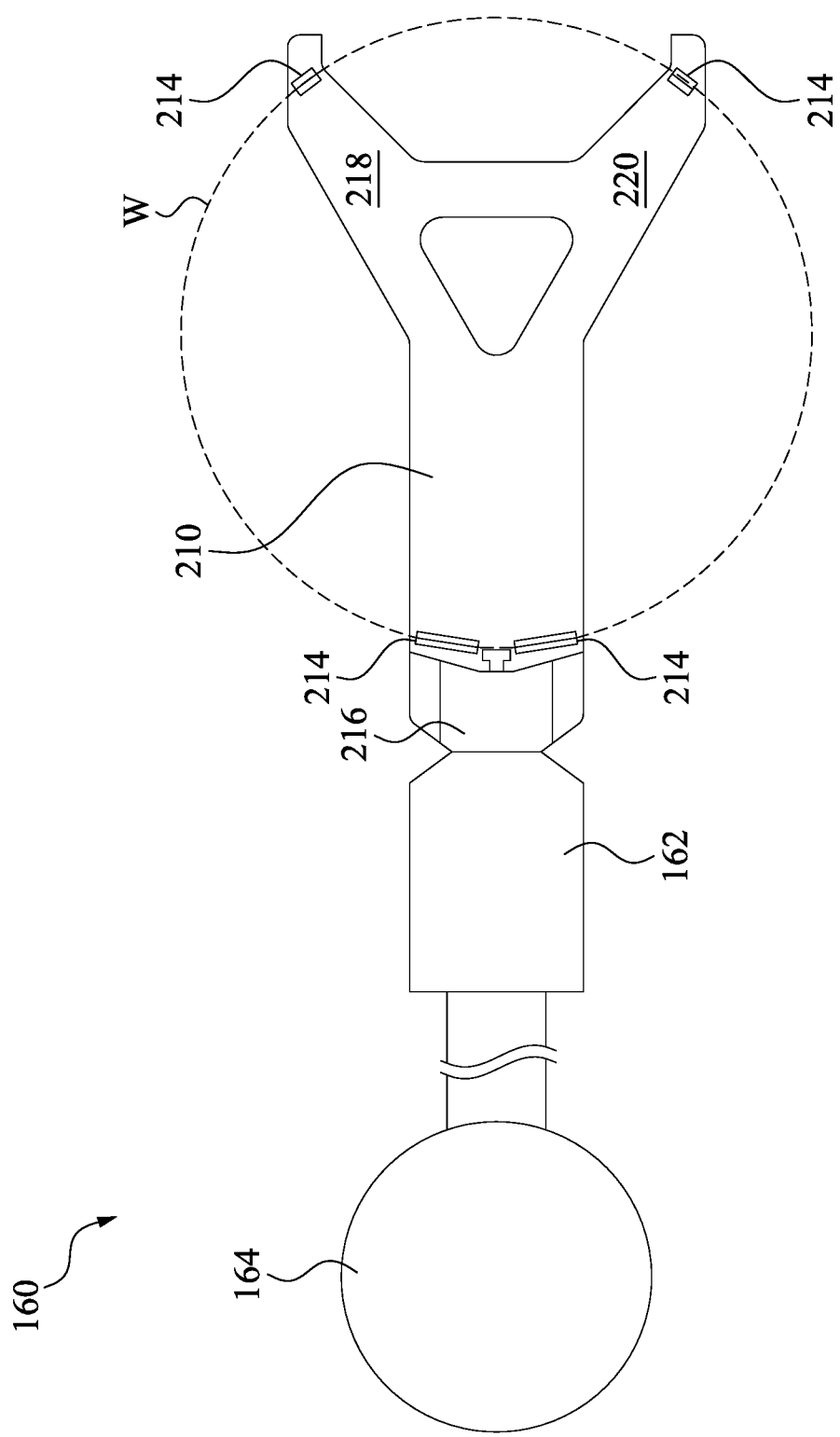
FIG. 3 is a top view of the robot arm mechanism, according to some embodiments of the disclosure.

Reference is made to both FIG. 2 and FIG. 3, in which FIG. 3 is a top view of the robot arm mechanism, according to some embodiments of the disclosure. The robot arm mechanism 160 includes a main body portion 164 including a plurality of motors (not shown) for moving the robot arm 162 in a multitude of directions. The plurality of motors in the main body portion 164 are capable of moving the robot arm 162 in at least radial, angular and vertical directions. The robot arm 162 includes an end effector 210, which has two forked distal ends 218 and 220. The end effector 210 receives wafer W between proximal end 216 and forked distal ends 218 and 220. In some embodiments, a plurality of contact pads 214 are disposed on the end effector 210 upon which wafer W is initially loaded. For example, a distal contact pad 214 is located at, or adjacent to, each of forked distal ends 218 and 220, and at least one proximal contact pad 214 is located adjacent the proximal end 216. In some embodiments, additional clamp structure may be located on the end effector 210 to help align and secure the wafer W.

When the wafer W is loaded on the end effector 210, the contact pads 214 would be the initial places where the wafer W contacts the end effector 210. Therefore, the chemicals that drip and adhere on the sidewall and the back surface of the wafer W may contact the contact pads 214 on the end effector 210 and become contaminants adhered on the contact pads 214 on the end effector 210. Such contaminants on the end effector 210 of the robot arm mechanism 160 may lead to unwanted transmission defects, such as wafer tilting or chamber polluting. Therefore, additional robot arm cleaning processes S20 are optionally inserted into the flow of FIG. 2 to remove the contaminants on the end effector 210.

In some embodiments, the robot arm cleaning processes S20 are performed after the preparing process, the coating process, and the developing process, to immediately remove the contaminants on the robot arm, after the robot arm 162 transfers the wafers W.

Figure 4:
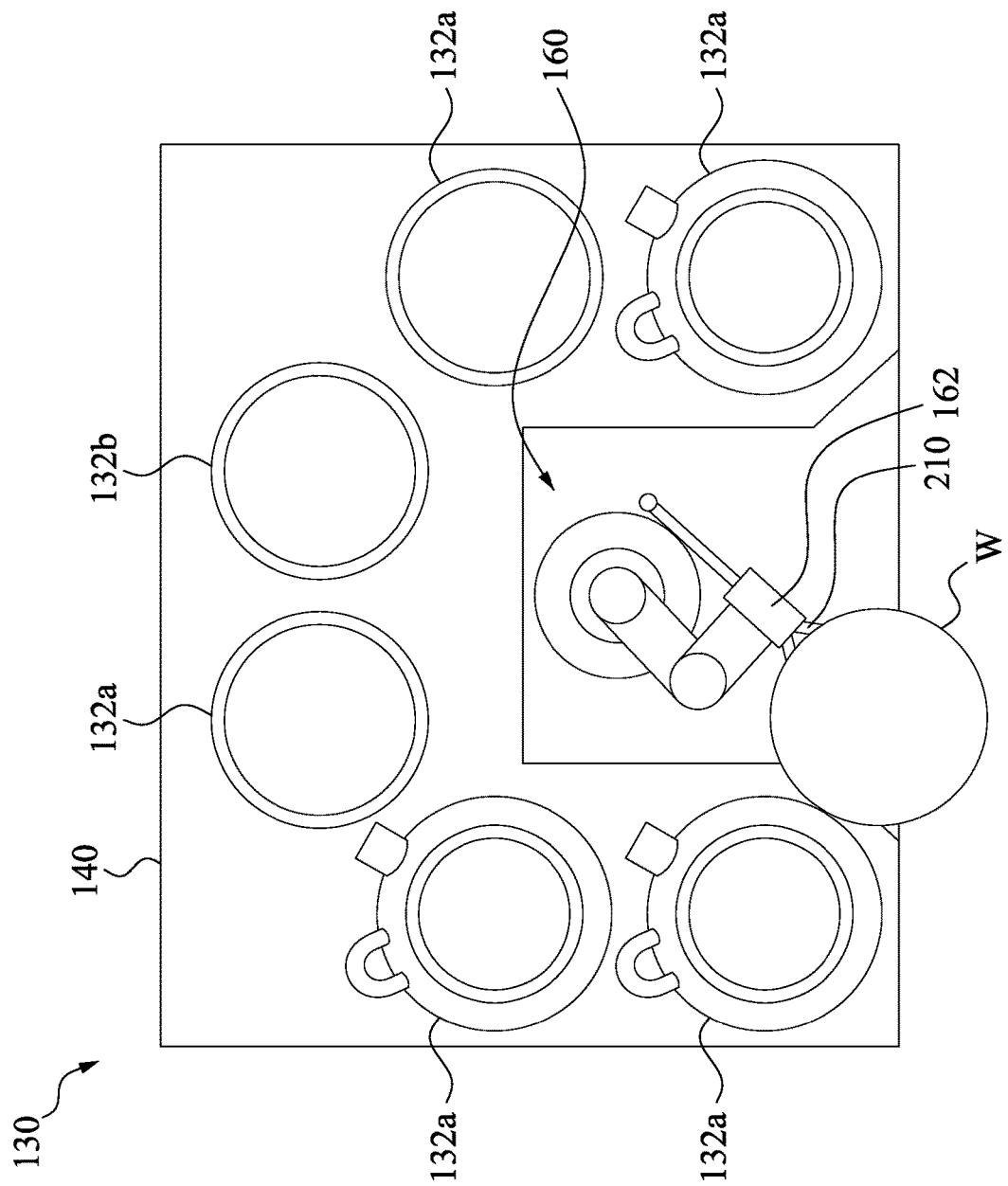
FIG. 4 is a schematic top view of the processing rack of the processing apparatus according to some embodiments of the disclosure.

Reference is made to FIG. 4, which is a schematic top view of the processing rack 130 of the processing apparatus according to some embodiments of the disclosure. The processing rack 130 includes plural chambers 132 and the robot arm mechanism 160 to deliver the wafer W between the chambers 132. In some embodiments, the chambers 132 includes processing chambers 132a and at least one dummy chamber 132b, in which the wafer W is delivered to and stored in the processing chambers 132a and bypasses the dummy chamber 132b. In some embodiments, only the end effector 210 of the robot arm 162 enters the dummy chamber 132b. That is, the end effector 210 of the robot arm 162 enters the dummy chamber 132b without wafer W thereon. The processing chambers 132a are configured to performed one or more fabricating processes, such as baking, coating, exposing, developing, or the like to the wafer W. The dummy chamber 132b is configured to clean the robot arm 162 and remove the contaminants on the end effector 210.

In some embodiments, the robot arm mechanism 160, the processing chambers 132a, and the dummy chamber 132b are all disposed in the same interior space of the enclosure 140. In some embodiments, the enclosure 140 is adapted to control the environment around the processing chambers 132a and the dummy chamber 132b. In some embodiments, an interior space of disposing the transfer module 120 and that of disposing the processing rack 130 are communicated, and they can cooperatively serve as the interior space of the enclosure 140.

Figure 5:
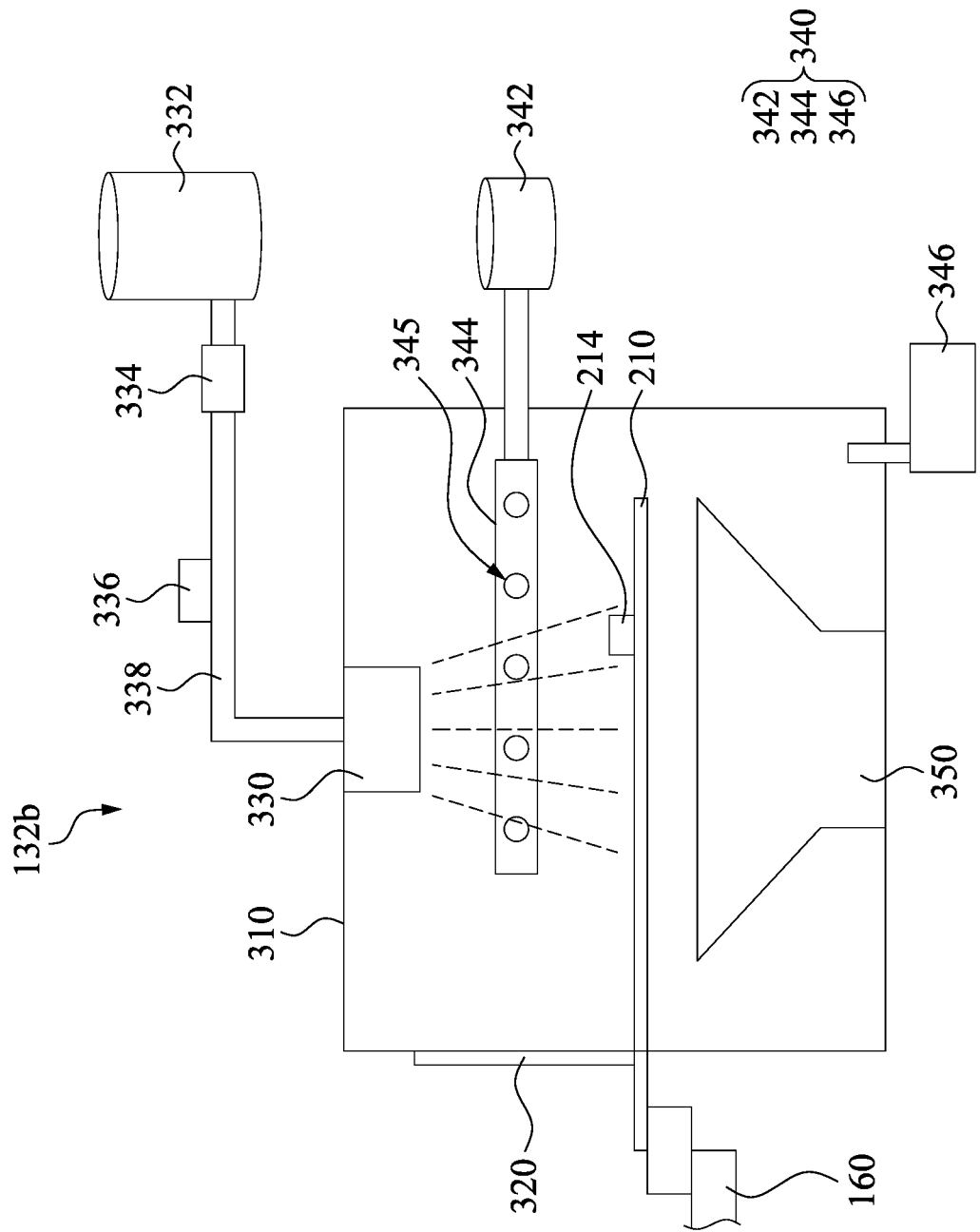
FIG. 5, FIG. 6, and FIG. 7 are schematic side views of the dummy chamber of the processing apparatus according to different embodiments of the disclosure.

Reference is made to FIG. 5, which is a schematic side view of the dummy chamber of the processing apparatus according to some embodiments of the disclosure. The dummy chamber 132b includes a housing 310 and a door 320 located at a side of the housing 310 for opening and closing the housing 310. The end effector 210 can enter the dummy chamber 132b via the door 320, and then the door 320 is closed to substantially seal the housing 310.

The dummy chamber 132b includes a shower head 330 disposed on the top portion of the dummy chamber 132b to dispense fluids to the end effector 210 to remove the contaminants on the contact pads 214 of the end effector 210. In some embodiments, the fluids include liquids to dissolve and carry out the contaminants from the contact pads 214 and the end effector 210. The dummy chamber 132b further includes a purge system 340 to provide purge gas into the dummy chamber 132b to dry the end effector 210.

In some embodiments, the dummy chamber 132b further includes a tank 332 connecting to the shower head 330 and a valve 334 disposed between the tank 332 and the shower head 330. The tank 332 can be, for example, a square, rectangular, oval or other shape that is adapted to store the liquids. In some embodiments, the tank 332 is located proximate to a wall, such as the top wall, of the housing 310. In some other embodiments, the tank 332 may be located away from the door 320 so that the position of the tank 332 will not interfere the entrance of the end effector 210. The tank 332 can be vertically or horizontally disposed on a sidewall, top wall or bottom wall of the housing 310. In some embodiments, the valve 334 may be a one-way valve which can be opened or closed by the controlling of a controller.

In some embodiments, the liquids stored in the tank 332 can include solvents that can dissolve the contaminants on the end effector 210. Example chemicals supplied to and by the shower head 330 include, for example, APM (ammonia hydroxide-hydrogen peroxide-wafer mixture), de-ionized water (DI-Water), SC1 (de-ionized water (DI), $NH_4OH$, $H_2O_2$), diluted $NH_4OH$, SC2 (DI, HCl, $H_2O_2$), ozonated de-ionized water ($DIWO_3$), SPM ($H_2SO_4$, $H_2O_2$), SOM ($H_2SO_4$, $O_3$), SPOM, $H_3PO_4$, dilute hydrofluoric acid (DHF), HF, HF/EG, HF/$HNO_3$, $NH_4OH$, HF, and/or other suitable chemicals. In some embodiments, the dummy chamber 132b further includes a heating device 336 disposed in contact with the tube 338 to heat the liquid in the tube 338, such that the liquid being dispensed on the end effector 210 may have a temperature higher than the environment, and the dissolving ability of the liquid can be improved. In some embodiments, a rinse liquid including DI-water is further sprayed on the end effector 210 to complete the cleaning process.

The dummy chamber 132b further includes a collector 350 to collect the liquid and the dissolved contaminants carried by the liquid that are drained from the end effector 210. In some embodiments, the liquid and the dissolved contaminants carried by the liquid are directly drained from the collector 350. In some other embodiments, the collector 350 is connected to the tank 332. The liquid and the dissolved contaminants carried by the liquid are filtered in the collector 350, and the liquid is recycled and stored to the tank 332.

In some embodiments, the purge system 340 includes a gas supply 342, at least one gas sprayer 344, and a gas exhauster 346. The gas sprayer 344 is disposed proximate to a wall, such as the top wall or the side wall, of the housing 310. A valve 348 can be coupled between the gas sprayer 344 and the gas supply 342 so as to control the gas volume to the dummy chamber 132b. In some embodiments, the gas sprayer 344 may be configured to provide a gas with a temperature substantially higher than a temperature of environment around the housing 310 of the dummy chamber 132b. In some embodiments, the gas may comprise at least one of nitrogen, helium, neon, argon, krypton, xenon, radon or other gas that is adequate to dry, remove or carry away moisture from the end effector 210 and the dummy chamber 132b.

In some embodiments, the gas sprayer 344 may include at least one tube, plate or other structure having at least one opening 345 such that the gas, e.g., hot nitrogen or the like, is capable of being provided into the dummy chamber 132b through the openings 345. In some embodiments, the openings 345 may be round, triangular, square, rectangular, or other shapes that are adequate to provide a desired amount of gas into the dummy chamber 132b. In some embodiments, the gas sprayer 344 having the openings 345 may be configured in the top, middle and/or bottom regions of the dummy chamber 132b such that the hot nitrogen can desirably remove moisture attached on the insider surfaces of the housing 310 and on the end effector 210.

By arranging the dummy chamber 132b in the processing rack 130, with other processing chambers 132a, as shown in FIG. 4 and FIG. 5, the robot arm 162 having the end effector 210 can enter the dummy chamber 132b and be cleaned up at the intervals between transferring the wafer. Therefore, the contaminants adhered on the end effector 210 can be removed immediately during the process.

Figure 6:
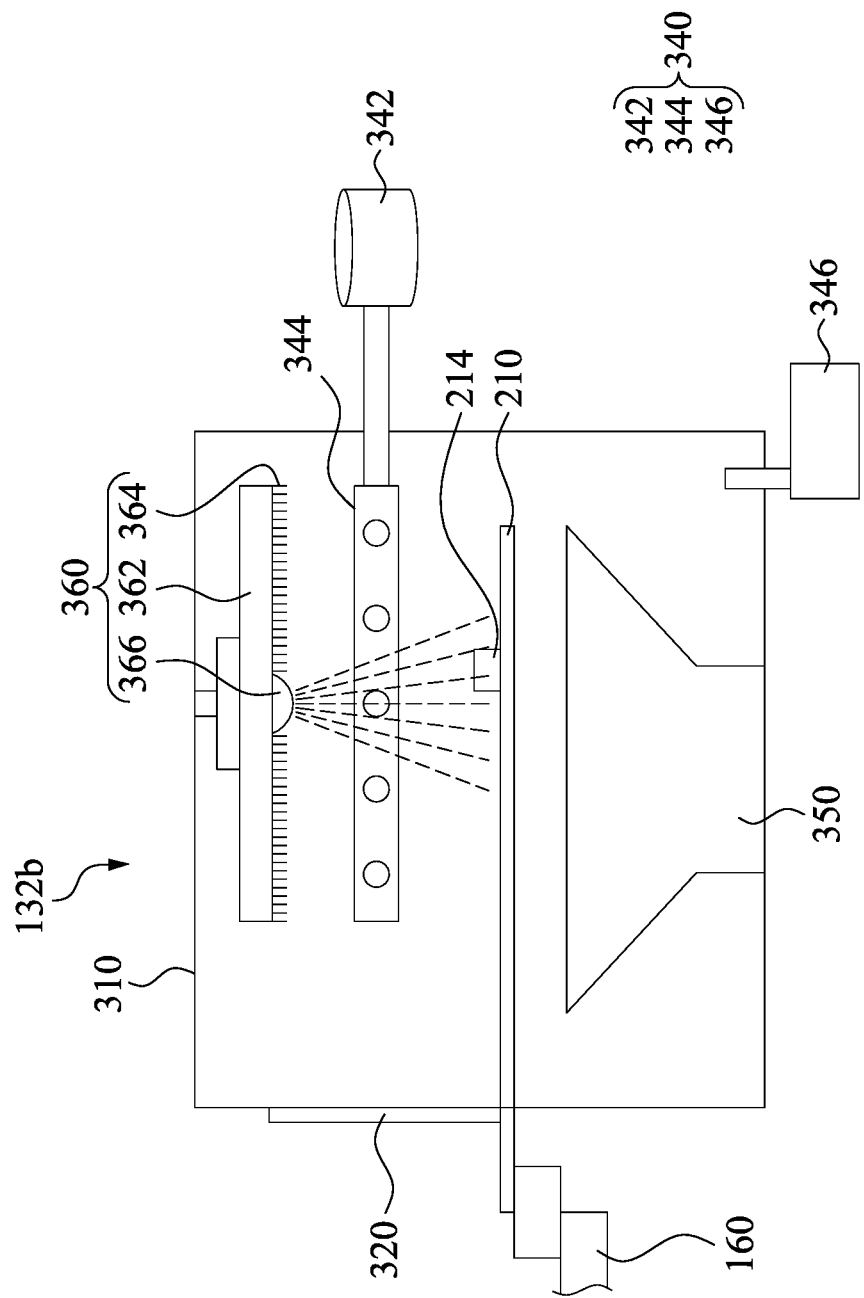

Reference is made to FIG. 6, which is a schematic side view of the dummy chamber of some other embodiments of the disclosure. The dummy chamber 132b includes the collector 350, the purge system 340, and a brush 360 configured over the end effector 210. The brush 360 includes a portion that is operable to contact the topside of the end effector 210. The brush 360 includes a base 362, bristles 364, and a nozzle 366. The base 362 is connected to a driving element, such that the brush 360 can be moved toward or away from the end effector 210. The bristles 364 of the brush may contact the topside of the end effector 210. In some embodiments, the bristles 364 include a flexible, comb-like configuration of material. Other embodiments are possible, including, for example, pads. Exemplary materials include polyvinyl alcohol (PVA) or other polymer. The brush 360 may rotate relative to the end effector 210 to remove the contaminants on the end effector 210. The nozzle 366 is configured to provide liquids to the topside of the end effector 210. Thus, the brush 360 provides chemical and physical cleaning to the end effector 210. The liquids provided to the end effector 210 via the nozzle 366 of the brush 360 may be the same as or different than that of the shower head 330, as discussed above.

Figure 7:
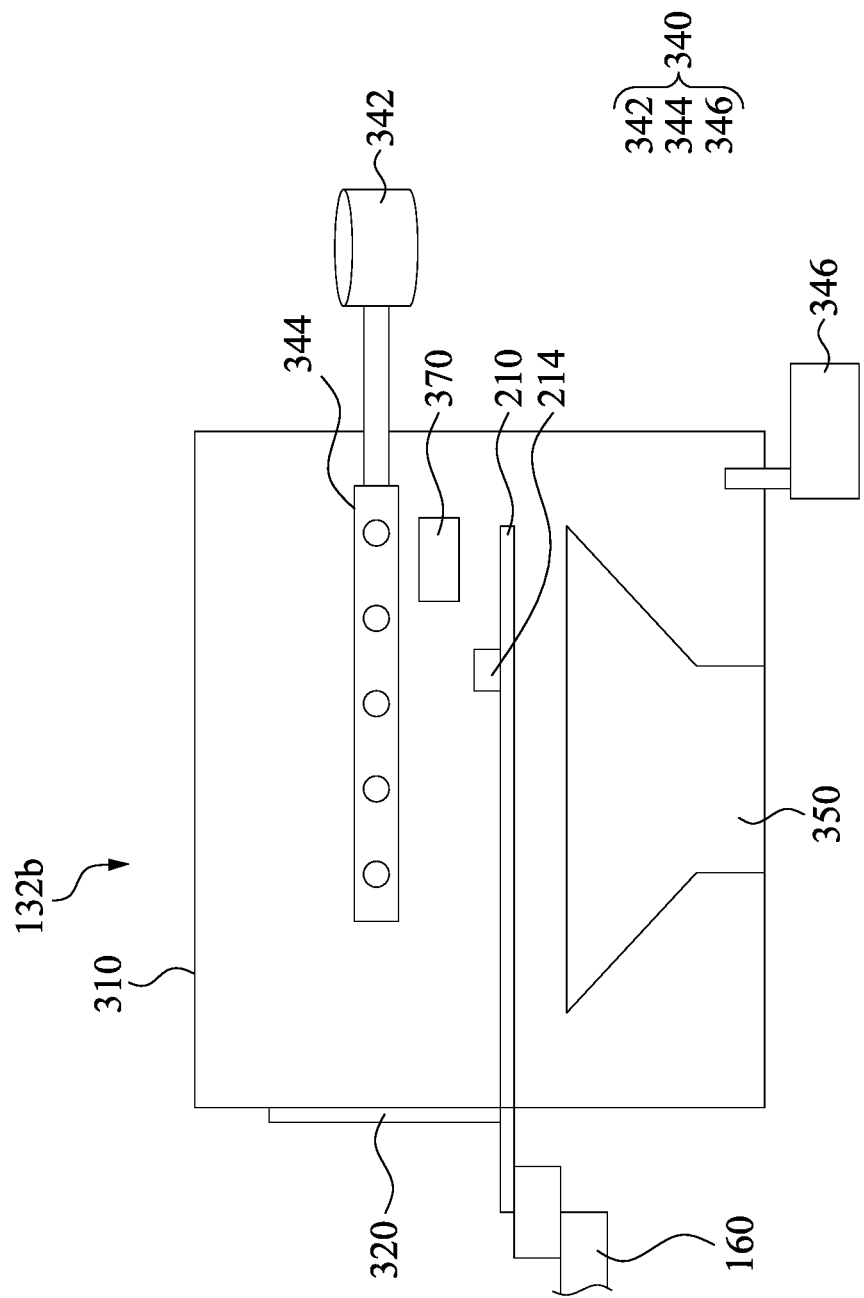

Reference is made to FIG. 7, which is a schematic side view of the dummy chamber of yet other embodiments of the disclosure. The dummy chamber 132b includes the purge system 340, and a cleaning device 370 configured adjacent the end effector 210. In some embodiments, the cleaning device 370 is a non-contact type cleaning device. For example, the cleaning device 370 can be an ultrasonic cleaner or an air knife. The contaminants on the end effector 210 are removed by the cleaning device 370, in a physical cleaning method, and the contaminants falling from the end effector 210 are carried and removed by the gas provided by the purge system 340 and the collector 350.

In some embodiments, the cleaning device 370 uses purge air knife technique for removing contaminants on the end effector 210. The high-pressure gas is generated and ejected on the surface of the end effector 210, so that contaminants attached to the surface of end effector 210 is removed. Contaminant removal efficiency can be improved by suitable adjusting the shape of the air knife.

Figure 8:
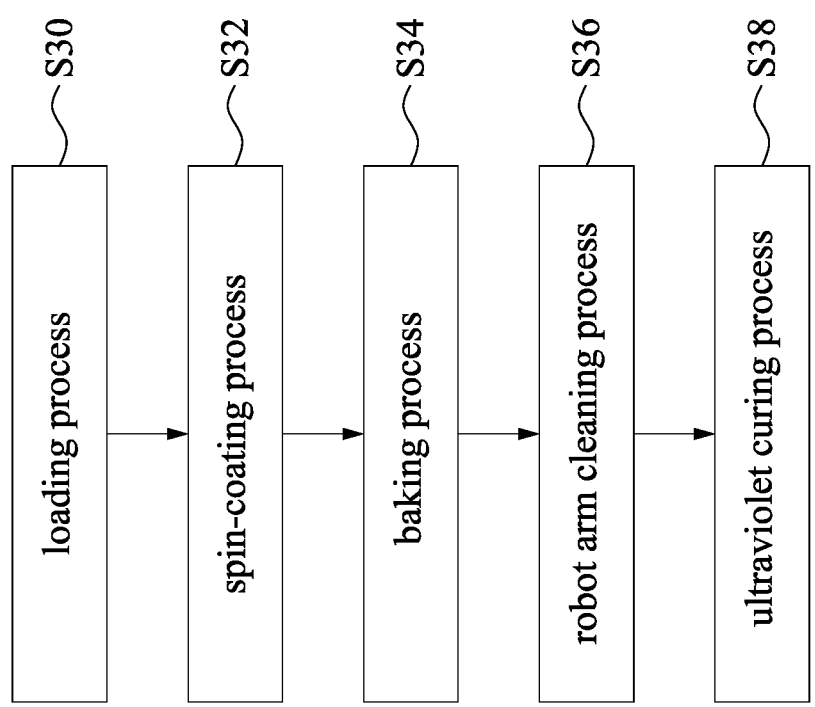
FIG. 8 is a flow chart of a processing method according to some other embodiments of the present disclosure.

In some other embodiments, the dummy chamber utilized to clean the end effector of the robot arm is not limited in the lithography process, but can be utilized in any suitable process. For example, as illustrated in FIG. 8, which is a flow chart of a processing method according to some other embodiments of the present disclosure, in step S30, a wafer is loaded into a spin coating chamber within the enclosure from the load port via the transfer module. For example, the front end robot of the transfer module can extract the wafer in the cassette placed on the load port and can transport the wafer into the enclosure.

In step S32, the wafer is spin-coated using devices in the spin coating chamber. For example, the wafer can be held by the spin chuck, the spin chuck spins, and the fluid dispense system can dispense fluid or solution onto the wafer held by the spin chuck. In some embodiments, the fluid includes an ultraviolet curable material.

In step S34, the spin-coated wafer can be transferred to a baking chamber via the robot arm mechanism. For example, the end effector of the robot arm mechanism can extract the spin-coated wafer in the spin coating chamber and can transport the spin-coated wafer to the baking chamber. In some embodiments, during the transferring the spin-coated wafer, the enclosure is kept closed to prevent contamination to the spin-coated wafer. The spin-coated wafer is soft-baked using devices in the baking chamber. For example, the spin-coated wafer can be placed on the baking plate, and the heat exchanging device may heat the baking plate to a predetermined temperature to perform the soft bake process.

In step S36, after the spin-coated wafer is transferred into the baking chamber, the end effector of the robot arm mechanism enters the dummy chamber, to remove the contaminants, e.g. the fluid or solution dispensed on the wafer and adhered on the end effector during the transferring the wafer. As discussed above, the contaminants can be removed by a chemical or a cleaner, such as a brush, an air knife, an ultrasonic cleaner, or the like.

In step S38, the soft-baked wafer can be transferred to an ultraviolet curing chamber via the end effector of the robot arm mechanism. The soft-baked wafer can be cured using ultraviolet radiation generated in the ultraviolet curing chamber. For example, the soft-baked wafer can be placed on the pedestal in the ultraviolet curing chamber, and the ultraviolet lamp bulb in the ultraviolet curing chamber may be excited to generate ultraviolet radiation to irradiate the soft-baked wafer, so that the soft-baked wafer can be cured by the ultraviolet radiation.

Because the end effector of the robot arm mechanism is cleaned in the dummy chamber before it extracts the soft-baked wafer in the baking chamber and transports the soft-baked wafer to the ultraviolet curing chamber, the contaminants including the dispensing fluid would not re-adhered to the soft-baked wafer. Because the end effector of the robot arm mechanism is cleaned in the dummy chamber before it transports the soft-baked wafer to the ultraviolet curing chamber, the contaminants including the dispensing fluid are removed before they are completely cured in the ultraviolet curing chamber. Therefore, the problem of wafer polluted by the end effector of the robot arm mechanism can be prevented. In addition, once the dispensed fluid thereon has been soft-baked, the fluid would be semi-solidified. The semi-solidified fluid would not drip from the sidewall of the wafer easily, and the end effector of the robot arm can be free from being polluted by the fluid when the wafer is extracted by the end effector of the robot arm.

The present disclosure provides a processing apparatus that includes a dummy chamber for cleaning the robot arm in the processing rack. The dummy chamber and the processing chambers are located in the same enclosure of the processing rack, and the robot arm cleaning process can be added into the intervals between transferring the wafer. The contaminants on the robot arm, such as in the contact pads of the end effector of the robot arm are removed, such that the situation of the wafer being polluted by the contaminants on the robot arm can be prevented.

According to some embodiments of the disclosure, a method includes transferring a wafer into a first processing chamber by using a robot arm mechanism, and applying a photoresist on the wafer in a first processing chamber. The wafer is transferred from the first processing chamber into a second processing chamber by using the robot arm mechanism, and the photoresist is exposed to a pattern of light in the second processing chamber. The method includes transferring the wafer from the second processing chamber into a third processing chamber by using the robot arm mechanism, and developing the exposed wafer in the third processing chamber. The method includes cleaning the robot arm mechanism in a dummy chamber.

According to some embodiments of the disclosure, a method includes spin-coating a fluid on a wafer in a first processing chamber, transferring the wafer from the first processing chamber into a second processing chamber by using a robot arm mechanism, baking the wafer in the second processing chamber, cleaning the robot arm mechanism in a dummy chamber, after the transferring the wafer from the first processing chamber into the second processing chamber, and transferring the wafer from the second processing chamber into a third processing chamber by using the robot arm mechanism.

According to some embodiments of the disclosure, a processing apparatus includes a processing rack. The processing rack includes an enclosure, a plurality of processing chambers disposed in the enclosure, a robot arm mechanism disposed in the enclosure to transfer a wafer between the processing chambers, a dummy chamber disposed in the enclosure, in which the dummy chamber has a cleaning device to clean an end effector of the robot arm mechanism.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   transferring a wafer into a first processing chamber by using an end effector of a robot arm mechanism such that the wafer is in contact with a contact pad of the end effector;
   applying a photoresist on the wafer in the first processing chamber;
   transferring the wafer from the first processing chamber into a second processing chamber by using the robot arm mechanism;
   exposing the photoresist to a pattern of light in the second processing chamber;
   picking the wafer by using the robot arm mechanism;
   moving the robot arm mechanism with the wafer from the second processing chamber into a third processing chamber;
   disposing the wafer in the third processing chamber;
   developing the photoresist on the wafer in the third processing chamber;
   moving the robot arm mechanism to a dummy chamber after disposing the wafer in the third processing chamber;
   cleaning the robot arm mechanism in the dummy chamber, wherein cleaning the robot arm mechanism is performed using a chemical liquid, and cleaning the robot arm mechanism comprises drying the end effector using a gas flow horizontally ejected, from a gas sprayer, to the end effector, wherein the gas sprayer has a tube horizontally extending at a position higher than the end effector, and a plurality of gas ejection openings on a side surface of the tube, a bottom of the gas sprayer is at a position higher than a top of the end effector of the robot arm mechanism, and the gas flow is ejected from the gas ejection openings of the gas sprayer;
   draining the chemical liquid through a funnel collector in the dummy chamber, wherein the funnel collector is disposed directly under the contact pad of the end effector of the robot arm mechanism; and
   transferring the wafer from the third processing chamber to a load port,
   wherein cleaning the robot arm mechanism in the dummy chamber is performed after transferring the wafer from the second processing chamber into the third processing chamber and before transferring the wafer from the third processing chamber to the load port.

2. The method of claim 1, wherein the wafer bypasses the dummy chamber.

3. The method of claim 1, further comprising extracting the wafer from the first, second, or third processing chamber by the end effector of the robot arm mechanism, wherein cleaning the robot arm mechanism further comprises removing contaminants on the end effector.

4. The method of claim 1, wherein developing the photoresist on the wafer in the third processing chamber comprises applying a develop agent on the wafer, and cleaning the robot arm mechanism is performed after developing the photoresist on the wafer in the third processing chamber.

5. The method of claim 1, further comprising applying an adhesion promoter on the wafer in a fourth processing chamber before the wafer is transferred into the first processing chamber.

6. The method of claim 1, wherein the chemical liquid is dispensed on the end effector of the robot arm mechanism.

7. The method of claim 6, wherein drying the end effector of the robot arm mechanism is performed after dispensing the chemical liquid on the end effector of the robot arm mechanism.

8. The method of claim 7, wherein drying the end effector of the robot arm mechanism comprises using nitrogen.

9. The method of claim 1, wherein the wafer is transferred in the first, second, or third processing chamber directly by the robot arm mechanism.

10. The method of claim 1, further comprising:
    providing an enclosure having a single interior space;
    providing a load port adjacent to the enclosure and external to the single interior space of the enclosure, wherein the load port has a door, and the load port spatially isolates the single interior space of the enclosure from an area outside of the enclosure when the door of the load port is closed, the load port accepting one or more cassettes that may contain one or more wafers, one of which is said wafer transferred into the first processing chamber; and
    disposing the robot arm mechanism, the first processing chamber, the second processing chamber, the third processing chamber, and the dummy chamber in the single interior space of the enclosure.

11. The method of claim 1, further comprising: recycling the chemical liquid.

12. The method of claim 1, wherein transferring the wafer into the first processing chamber is such that the wafer is directly above a forked distal end of the end effector, and draining the chemical liquid through the funnel collector of the dummy chamber is further such that the funnel collector is disposed directly under the forked distal end of the end effector of the robot arm mechanism.

13. The method of claim 1, wherein cleaning the robot arm mechanism is further performed using a bristle, and draining the chemical liquid through the funnel collector of the dummy chamber is further such that the robot arm mechanism is directly between the bristle and the funnel collector.

14. A method, comprising:
- spin-coating an ultraviolet curable material on a wafer in a first processing chamber, wherein a portion of the ultraviolet curable material adheres to a robot arm mechanism;
- transferring the wafer from the first processing chamber into a second processing chamber by using the robot arm mechanism such that the wafer is in contact with a contact pad of an end effector of the robot arm mechanism;
- baking the wafer in the second processing chamber;
- cleaning the robot arm mechanism in a dummy chamber by using a cleaning device to remove said portion of the ultraviolet curable material that adheres to the robot arm mechanism from the robot arm mechanism, wherein the cleaning device comprises a brush, and cleaning the robot arm mechanism comprises rotating the brush relative to the end effector of the robot arm mechanism such that the brush faces the contact pad to remove said portion of the ultraviolet curable material that adheres to the robot arm mechanism;
- drying the end effector using a gas flow, from a gas sprayer, to the end effector, wherein the gas sprayer has a tube horizontally extending at a position higher than the end effector, and a plurality of gas ejection openings on a side surface of the tube, a bottom of the gas sprayer is at a position higher than a top of the end effector of the robot arm mechanism, and the gas flow is ejected from the gas ejection openings of the gas sprayer;
- transferring the wafer from the second processing chamber into a third processing chamber by using the robot arm mechanism; and
- curing the ultraviolet curable material on the wafer in the third processing chamber using ultraviolet light,
- wherein cleaning the robot arm mechanism in the dummy chamber is performed after transferring the wafer from the first processing chamber into the second processing chamber and before transferring the wafer from the second processing chamber into the third processing chamber.

15. A processing apparatus, comprising:
- a processing rack, comprising;
  - an enclosure;
  - a plurality of processing chambers disposed in the enclosure; and
  - a robot arm mechanism disposed in the enclosure to transfer a wafer between the processing chambers;
- a dummy chamber disposed in the enclosure;
- a cleaning device disposed in the dummy chamber, wherein the cleaning device comprises a base, a nozzle on the base, and a plurality of bristles on the base and surrounding the nozzle, and the bristles are movable toward or away from an end effector of the robot arm mechanism;
- a gas sprayer in the dummy chamber, wherein the gas sprayer has a tube horizontally extending at a position higher than the end effector, and a plurality of gas ejection openings on a side surface of the tube, a bottom of the gas sprayer is at a position higher than a top of the end effector of the robot arm mechanism; and
- a transfer module, wherein the robot arm mechanism is disposed between the transfer module and the processing chambers.

16. The processing apparatus of claim 15, wherein the nozzle is configured to dispense fluids to the end effector.

17. The processing apparatus of claim 15, wherein the dummy chamber comprises a purge system.

18. The processing apparatus of claim 15, further comprising:
- at least one load port,
- wherein the transfer module is disposed between the load port and the processing rack.

19. The processing apparatus of claim 15, further comprising a gas exhauster, wherein a top of the gas exhauster is at a position lower than a bottom of the end effector of the robot arm mechanism.

20. The processing apparatus of claim 15, wherein the gas sprayer is configured to provide a heated nitrogen gas.

* * * * *